United States Patent [19]

Nakao et al.

[11] Patent Number: 4,864,163
[45] Date of Patent: Sep. 5, 1989

[54] METHOD FOR DETECTING INPUT AC VOLTAGE

[75] Inventors: Fumiaki Nakao, Maisaka; Toshihiro Shimizu, Kosai; Noboru Kato, Arai, all of Japan

[73] Assignee: Fuji Electrochemical Co., Ltd., Tokyo, Japan

[21] Appl. No.: 171,891

[22] Filed: Mar. 22, 1988

[30] Foreign Application Priority Data

Mar. 27, 1987 [JP] Japan ............................ 62-71853

[51] Int. Cl.⁴ .................................... H03K 5/153
[52] U.S. Cl. ............................ 307/362; 307/234; 328/28; 328/32; 328/111; 328/150
[58] Field of Search .................. 307/350, 362, 234; 328/26, 28, 32, 146, 148, 149, 150, 111, 115, 120

[56] References Cited

U.S. PATENT DOCUMENTS 3,846,692 11/1974 Hill ........................................ 328/26
3,852,731 12/1974 Hollands ............................. 307/234

FOREIGN PATENT DOCUMENTS 61-189168 8/1986 Japan .

OTHER PUBLICATIONS

B. Voynovich, "Bipolar Single Channel Analyser", New Electron, vol. 10, No. 7, Apr. 5, 1977, p. 63.

*Primary Examiner*—John Zazworsky
*Attorney, Agent, or Firm*—Barnes & Thornburg

[57] ABSTRACT

A rectified ac voltage which is not smoothed is compared with a reference voltage directly, and a pulse is generated when the instantaneous value of the rectified ac voltage exceeds the reference voltage. Based on the pulse generation, a judgement is performed on whether the ac voltage is reaching a predetermined value or not. These operations allow the abnormality of the ac voltage to be rapidly detected with improved accuracy.

4 Claims, 2 Drawing Sheets

METHOD FOR DETECTING INPUT AC VOLTAGE

BACKGROUND OF THE INVENTION

1. Field of the Invention

The present invention relates generally to a method for detecting input ac voltage and more specifically to a method for detecting whether the crest value of the input voltage is reaching a predetermined voltage or not.

2. Description of the Prior Art

Generally, apparatus such as electric devices are driven by commercial power sources with a voltage of 100 VAC and others, or driven through stabilized dc power sources which convert the ac voltage of commercial power source to a predetermined level dc voltage to be supplied. In that case, however, if the commercial power supply is interrupted or an instantaneous drop of the voltage, namely an instantaneous decrease of the crest value, occurs, various troubles may be caused in the electric device.

In order to solve such a problem, there has been proposed a stabilized dc power source provided with an emergency power source such as a battery which supplies a voltage for a predetermined period of time if the power supply is interrupted or other abnormality happens. By using this power source, a predetermined voltage can be supplied for a predetermined period of time; however, if the phenomenon such as the power supply interruption continues, the supplied voltage decreases to cause malfunction, breakdown, etc. of the electric device or the like. Therefore, it is desirable that the abnormality such as the aforementioned power supply interruption is rapidly detected and notified to the following electric device and others.

Apparatus, stabilized power sources, and so forth which can be utilized for both of the commercial power sources with voltages of 100 V and 200 V by automatically alternating a switch through detecting the voltage difference are also known. In this case, the level of the input voltage should be detected quickly and accurately.

Consequently, a method for the detection by using a means comprising a circuit shown in FIG. 1 (a) has been conventionally used. Namely, the voltage which is provided by the full-wave rectification of an input voltage and is supplied through a diode D1 is smoothed by a capacitor C1 connected between the terminals of an input power source, and is compared with a reference voltage E1 supplied from a reference power source 2 by a comparator 1 having hysteresis. As shown in FIG. 1 (b), when the voltage between the terminals of the capacitor C1 becomes lower than the reference voltage E1, an output of the comparator 1 varies, detecting an abnormal condition. In other words, when the power supply is interrupted, the charge stored in the capacitor C1 is discharged by a given amount and the terminal voltage of the capacitor C1 becomes smaller than the reference voltage E1, resulting in alternation of the output of the comparator 1.

However, in accordance with the conventional method described above, since the capacitor C1 is employed a large amount of current supplied by the input voltage flows into the capacitor C1, causing wave-form distortion due to the impedance of the signal source. As a result, the real crest value cannot be detected and it is difficult to determine the setting level of the reference voltage E1 serving as the reference for the abnormality detection.

Also, the charge amount in the capacitor C1 depends on the condition of the signal source, namely the crest value (instantaneous value), just before the occurrence of the abnormality such as the power supply interruption. This causes a variation of the time required for the charging, resulting in fluctuation of detection time.

Furthermore, the charge stored in the capacitor C1 is discharged in a single discharging operation when the power supply is interrupted. However, in case of the instantaneous drop where the voltage does not reach the predetermined value, the capacitor C1 is slightly charged while discharging and this charge-discharge operation is repeated alternately, decreasing the charge stored in the capacitor C1 gradually. Therefore, in the instantaneous drop it takes a longer time until the voltage between the terminals of capacitor C1 decreases to a value at which the output of the comparator 1 changes, and the detection time becomes longer than that for the power supply interruption. Thus, there is also a problem that the detection time fluctuates due to the type of the abnormal condition.

SUMMARY OF THE INVENTION

The present invention has been accomplished in view of the problems described above, and an object thereof is to provide a method for detecting an input ac voltage which enables to detect the abnormality or the like of the input signal rapidly and accurately.

In order to achieve the aforementioned object, a method for detecting the input ac voltage according to the present invention comprises the steps of rectifying an ac voltage, comparing the rectified ac voltage with a reference voltage directly without smoothing the ac voltage, generating a pulse when an instantaneous value of the rectified voltage exceeds the reference voltage, and judging whether the ac voltage is reaching a predetermined voltage value or not based on the pulse generation.

The ac voltage to be measured is rectified and then, without being smoothed, compared with the reference voltage. When the instantaneous value of the rectified wave-form becomes larger than the reference voltage, a pulse is generated and it is recognized that the ac voltage is normal. On the other hand, when an instantaneous drop preventing the crest value of the rectified ac voltage from reaching the reference voltage or a power supply interruption is caused, the reference voltage is always higher than the other one, so that no pulse is generated. Therefore, abnormality is detected.

The present invention will be understood more fully from the detailed description given herebelow and from the accompanying drawings of the preferred embodiments of the invention, which however, should not be taken to limit the invention to the specific embodiments but are for explanation and understanding only.

BRIEF DESCRIPTION OF THE DRAWINGS

FIG. 1 (b) is a graph showing a terminal voltage of a capacitor in the detecting circuit of FIG. 1 (a);

DESCRIPTION OF THE PREFERRED EMBODIMENTS

Figure 1A:
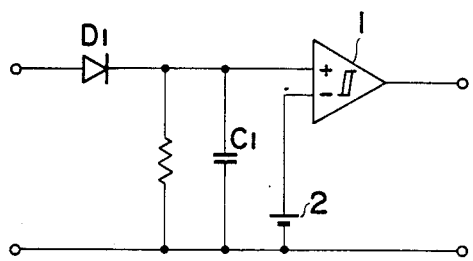
FIG. 1 (a) is a circuit diagram showing a conventional detecting circuit.
Figure 1B:
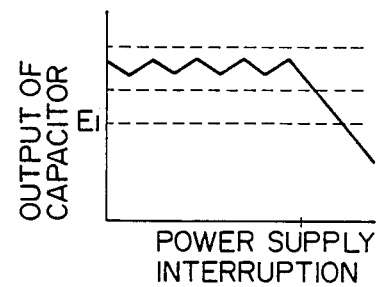

Referring to the drawings, preferred embodiments of the present invention will be described.

Figure 2:
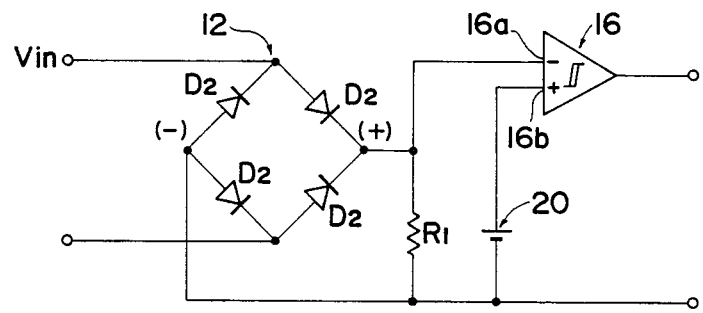
FIG. 2 is a circuit diagram showing a preferred example of a detecting circuit for implementing a method for detecting an input ac voltage according to the invention.

As shown in FIG. 2, an input ac voltage Vin to be measured is applied to the input terminals of a bridge rectifying circuit 12 comprising four diodes D2. A first resistor R1 is connected between the output terminals of the bridge rectifying circuit 12. One of the output terminals (positive) of the rectifying circuit 12 is connected to an inverting input terminal 16a of a first comparator 16 and the other terminal (negative) is directly connected to an output ground terminal. A non-inverting input terminal 16b of the comparator 16 is connected to a reference power source 20.

In this embodiment, a comparator with hysteresis is employed as the comparator 16. Therefore, once a voltage larger than a first reference voltage E1 defined by the reference power source 20 is input to the comparator 16 to change the output signal thereof from a high level to a low level, the output signal does not return to the high level instantly even if the input voltage becomes lower than the first reference voltage E1; the output of the comparator 16 remains in the low level until the input voltage decreases to a second reference voltage E2 (E2<E1) where the signal changes to the high level. In other words, even if the input voltage reaches the reference voltage E1 and then quickly drops, a pulse with a certain width is output. Note that the term "pulse" used herein is said to be generated when the output of the comparator 16 is in the low level, with the high level as a reference.

Detection of the input voltage abnormality by using the detecting circuit constituted as described above is carried out as follows. The input voltage rectified by the bridge rectifying circuit 12 is directly fed to the inverting input terminal 16a of the comparator 16 and compared with the first reference voltage E1 which is input to the non-inverting input terminal 16b of the comparator 16. If the input voltage is higher than the first reference voltage E1, the output of the comparator 16 is at the low level. On the contrary, the output is at the high level if the input voltage is lower than the reference voltage. Thus, when the input voltage is normal and its crest value is constant, a sequence of cyclic pulses with the same width are output.

On the other hand, if the crest value of the input voltage does not reach the first reference voltage E1 due to the instantaneous drop, the power supply interruption or the like, the voltage at the non-inverting input terminal 16b is always higher than the voltage at the inverting terminal 16a, so that the output of the comparator 16 maintains the high level without changing to the low level. This means that no pulse is output, resulting in detection of abnormality due to the power supply interruption or the like.

When the crest value of the input voltage is high, the time in which the instantaneous value of the rectified input voltage reaches the first reference voltage E1 is short and it requires a longer time to drop to the second reference voltage E2 after reaching the first reference voltage and passing the peak, resulting in a long pulse width. Accordingly, if the pulse has been generated, it can be detected whether the crest value is high or low in accordance with the pulse width.

Figure 3:
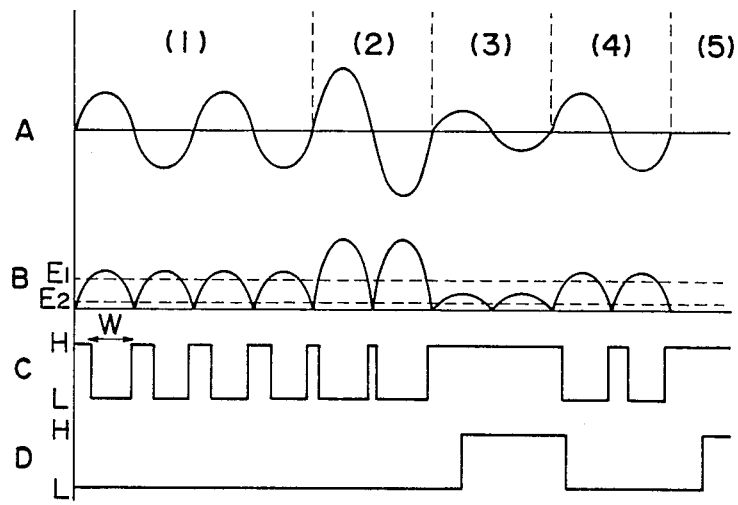
FIG. 3 is a timing chart for explanation of operational principle of the invention.

The operation of the aforementioned detecting circuit is now described with reference to FIG. 3 which shows a timing chart with wave-forms at respective portions in the circuit. Firstly in FIG. 3, a wave-form of the input voltage to be measured by the detecting circuit, i.e. a wave-form at the input terminals of the bridge rectifying circuit 12 is indicated at A, a wave-form input to the inverting input terminal 16a of the comparator 16 is at B, and an output wave-form of the comparator 16 is shown at C.

When the input voltage is in the normal region (1), the rectified voltage having a cyclic wave-form B with a constant crest value is input to the comparator 16 which outputs pulses with a predetermined pulse width W. The crest value of the input voltage then becomes high in the region (2), and pulses with larger widths are generated as described above.

On the other hand, when the input voltage instantaneously drops and its crest value becomes smaller than the first reference voltage E1 in the region (3), the input voltage having the wave-form B for the comparator 16 does not exceed the first reference voltage E1 either, so that the output C of the comparator 16 maintains the high level with generating no pulse. At the time the input voltage returns to be normal again (region (4)), the comparator 16 also outputs normal pulses. Thus, the period during which no pulse is generated is a period of the instantaneous drop.

Furthermore, in the region (5) where the power supply is interrupted, the output C of the comparator 16 is maintained in the high level and no pulse is generated as in the case of the instantaneous drop. If the power source is instantaneously interrupted, the output C is similar to that in the case of the instantaneous drop (no pulse is generated for a predetermined period of time, and when the normality is recovered, a sequence of pulses begin to be generated).

Figure 4:
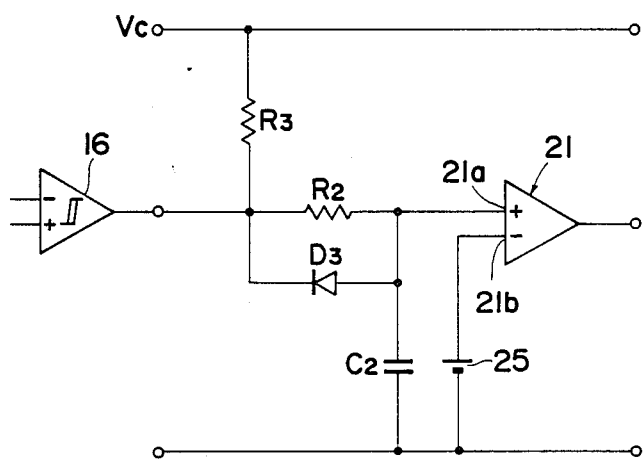
FIG. 4 is a circuit diagram showing a judging circuit for performing judgement on an output voltage of the detecting circuit.

Next, a circuit and a method for judging the output condition of the aforementioned first comparator 16 simply and accurately is described. As shown in FIG. 4, the output terminal of the first comparator 16 is connected to a non-inverting input terminal 21a of a second comparator 21 through a second resistor R2. The non-inverting input terminal 21a is also connected to the ground through a capacitor C2, and a diode D3 is connected between the terminals of the aforementioned second resistor R2 so that a current flows from the second comparator 21 to the comparator 16. One of the terminals of a third resistor R3 having a sufficiently smaller resistance than that of the second resistor R2 is connected to the resistor R2 terminal for the first comparator 16, and the other terminal of the third resistor R3 is connected to a charging power source Vc. Accordingly, the power source Vc is applied to the capacitor C2 and to the non-inverting input terminal 21a through the third and the second resistors R3 and R2 connected in series.

On the other hand, a second reference power source 25 is connected to an inverting input terminal 21b of the second comparator 21.

Figure 5:
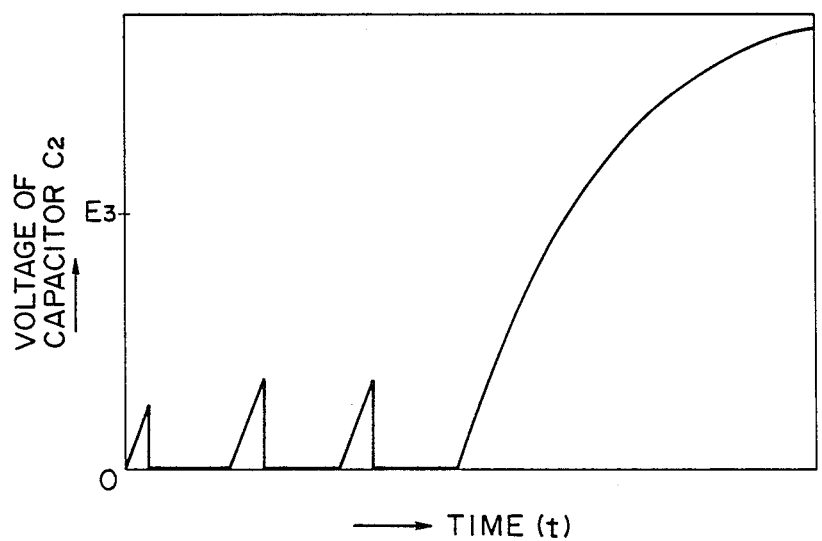
FIG. 5 is a graph showing a capacitor terminal voltage input to a second comparator.

The judging operation by this circuit is as follows. When the output of the first comparator 16 is at the high level, the output terminal of the first comparator 16 is isolated from the ground, so that the capacitor C2 is charged by the charging power source Vc through the third and the second resistors R3 and R2 and the voltage between the terminals of the capacitor C2 is input to the non-inverting input terminal 21a of the second comparator 21. However, so far as the input voltage is normal, the output of the first comparator 16 alters from the high to the low level after a lapse of a given time and therefore the output terminal of the first comparator 16 and the ground are shorted, allowing the charge stored in the capacitor C2 to be discharged almost instantly through the diode D3. Since the cycle (interval) for the high-low alternation of the output is constant, the maximum amount of the charge in the capacitor C2 is also constant. When the abnormal condition due to the instantaneous drop, the power supply interruption or the like happens, the output of the first comparator 16 is maintained in the high level as described above, so that the capacitor C2 continues to be charged and its terminal voltage increases continuously (see FIG. 5).

Therefore, by setting a third reference voltage E3 defined by the second reference power source 25 to a value larger than the maximum terminal voltage of the capacitor C2 in the normal condition, the output of the second comparator 21 is always at the low level. If the abnormal condition due to the instantaneous drop, the power supply interruption or the like takes place, the terminal voltage of the capacitor C2 keeps on increasing to exceed the third reference voltage E3, bringing the output of the second comparator 21 to switch to the high level for notifying the abnormality of the input voltage. After the input voltage has recovered the normality, the charge stored in capacitor C2 is discharged during a period where the output of the first comparator 16 is at the low level, so that the output of the second comparator 21 returns to the low level (see the wave-form D in FIG. 3).

The value of the third reference voltage E3 is required to be set relatively low in order to detect the abnormality as rapidly as possible but it should be sufficiently larger than the maximum charged voltage of the capacitor C2 in the normal condition in order to prevent malfunctioning of the circuit. Therefore, the voltage E3 should be so set as to fulfill the both requirements.

As set forth above, the method for detecting the input ac voltage according to the present invention enables to detect the abnormality of the input voltage essentially without using a capacitor, so that the wave-form of an input voltage signal even from a high impedance source can be also accurately detected.

Further, since the input voltage is judged through directly comparing the instantaneous value of the rectified voltage with the reference voltage, which is different from the conventional method in which the abnormality is detected after the discharge of the capacitor, the information on the abnormality or the like can be provided rapidly and within a substantially constant period of time, independently of the crest value just before the occurrence of the abnormal condition. Similarly, the abnormality can be detected within the constant period of time, independently of whether it is the instantaneous drop or the power supply interruption.

In the illustrated embodiment the input voltage is applied to the inverting input terminal 16a of the comparator 16 so as to make the succeeding judging circuit output the "high" level signal during the abnormality. It is apparent, however, that the input voltage may be applied to the non-inverting input terminal 16b, depending on a circuit or device provided in the following stage.

Furthermore, the present invention should not be limited to the circuit as described and illustrated, and various circuit arrangements may be made for implementing the invention.

What is claimed is:

1. A method for detecting an input ac voltage comprising the steps of:
   rectifying an ac voltage;
   comparing by a first comparator with hysteresis said rectified ac voltage with a reference voltage directly without smoothing said ac voltage;
   generating a pulse when the instantaneous value o: said rectified ac voltage exceeds said reference voltage; and
   judging whether or not said ac voltage is reaching a predetermined voltage value by a second comparator for comparing a terminal voltage of a capacitor which is charged when said pulse is not generated with another reference voltage to generate a signal when said pulse is not generated for a predetermined period of time.

2. A method for detecting an input ac voltage as claimed in claim 1, wherein said rectifying step is performed by a bridge rectifying circuit.

3. A method for detecting an input ac voltage as claimed in claim 1, wherein said comparing step further comprises the steps of inputting said rectified ac voltage to one of the input terminals of said first comparator with hysteresis and inputting said reference voltage to the other input terminal of said first comparator with hysteresis.

4. A method for detecting an input ac voltage as claimed in claim 1, wherein said pulse generating step further comprises the steps of comparing said rectified ac voltage by said first comparator with hysteresis with a first reference voltage, changing an output of said first comparator from a first level to a second level when said rectified ac voltage at least equals said first reference voltage, comparing said rectified ac voltage by said first comparator with hysteresis with a second reference voltage once said rectified ac voltage at least equals said first reference voltage and changing said output of said first comparator with hysteresis from said second level to said first level when said rectified ac voltage decrease to said second reference voltage to generate a pulse having a certain width.

* * * * *